United States Patent
Uozumi

(10) Patent No.: US 8,211,800 B2
(45) Date of Patent: Jul. 3, 2012

(54) RU CAP METAL POST CLEANING METHOD AND CLEANING CHEMICAL

(75) Inventor: Yoshihiro Uozumi, Somers, NY (US)

(73) Assignee: Kabushiki Kaisha Toshiba, Tokyo (JP)

( * ) Notice: Subject to any disclaimer, the term of this patent is extended or adjusted under 35 U.S.C. 154(b) by 22 days.

(21) Appl. No.: 12/861,235

(22) Filed: Aug. 23, 2010

(65) Prior Publication Data

US 2012/0045898 A1   Feb. 23, 2012

(51) Int. Cl.
*H01L 21/44* (2006.01)

(52) U.S. Cl. ........ 438/686; 438/459; 438/653; 257/751; 257/E21.584

(58) Field of Classification Search .......... 438/459, 438/636, 653, 694, 686; 257/751, E21.584, 257/E23.161
See application file for complete search history.

(56) References Cited

U.S. PATENT DOCUMENTS

| | | | |
|---|---|---|---|
| 2002/0123235 A1* | 9/2002 | Kraus et al. | 438/755 |
| 2006/0219663 A1* | 10/2006 | Wang et al. | 216/88 |
| 2010/0248473 A1* | 9/2010 | Ishizaka et al. | 438/659 |

FOREIGN PATENT DOCUMENTS

| | | |
|---|---|---|
| JP | 2002-231676 | 8/2002 |
| JP | 2009-185335 | 8/2009 |

* cited by examiner

*Primary Examiner* — Phuc Dang
(74) *Attorney, Agent, or Firm* — Turocy & Watson, LLP

(57) ABSTRACT

According to certain embodiments, Ru is removed from the surface of a semiconductor structure by contact with a cleaning solution comprising one or more selected from permanganate ion, orthoperiodic ion and hypochlorous ion, such that Ru is removed from surfaces of the semiconductor substrate where the presence of Ru is undesirable. In some embodiments, a semiconductor structure is formed or provided having at least one metalized layer formed over an underlying layering or semiconductor substrate. The metalized layer contains a dielectric material with one or more metal wires of copper-containing material formed in a trench and/or via in the dielectric material. A cap layer having Ru is formed on the surface of the copper-containing material forming the one or more metal wires. The semiconductor structure is contacted with the cleaning solution comprising one or more selected from permanganate ion, orthoperiodic ion and hypochlorous ion to remove a portion of the Ru present in the semiconductor structure.

20 Claims, 5 Drawing Sheets

RU CAP METAL POST CLEANING METHOD AND CLEANING CHEMICAL

FIELD

Embodiments described herein generally relate to methods for removing Ru from the surface of a semiconductor structure where such presence of Ru is undesirable.

BACKGROUND

Copper is increasing being used as the metal component of metalized layers of semiconductor structures due to its higher conductivity and correspondingly increased efficiency in signal transmission compared to many other metals. Cap layers are being evaluated over copper-containing metallization layers to protect copper from oxidation, to improve adhesion to overlying layers and to decrease electromigration. Ru is one of the candidate materials as a cap layer or a component of a cap layer for such purposes.

A metalized layer is formed of a dielectric layer having a pattern of trenches and/or vias formed therein. The trenches and/or vias are filled in with a copper-containing material using the damascene or dual-damascene technique. Ru can be selectively deposited on the surface of the copper-containing material using chemical vapor deposition (CVD), plasma enhanced chemical vapor deposition (PECVD) and other deposition techniques.

As semiconductor structures are scaled down, the area of individual copper-containing metal lines decreases. Such decreased area increase the difficulty of depositing Ru on the surface copper-containing material filling the vias and/or trenches formed in the dielectric layer.

DETAILED DESCRIPTION

According to one embodiment, a semiconductor structure is formed or provided having at least one metalized layer formed over an underlying layering or semiconductor substrate. The metalized layer contains a dielectric material with one or more metal wires of copper-containing material formed in a trench and/or via in the dielectric material. A cap layer having Ru is formed on the surface of the copper-containing material forming the one or more metal wires. The semiconductor structure is contacted with a cleaning solution comprising one or more selected from permanganate ion, orthoperiodic ion and hypochlorous ion having a pH greater than about 4 to remove a portion of the Ru present in the semiconductor structure. In additional embodiments, Ru is removed from the surface of a semiconductor structure by contact with a cleaning solution comprising one or more selected from permanganate ion, orthoperiodic ion and hypochlorous ion having a pH greater than about 4, such that Ru is removed from surfaces of the semiconductor substrate where the presence of Ru is undesirable.

A Ru cap layer is formed on the surface of a metal wire having a copper-containing material to function to reduce electromigration, protect against oxidation and/or improve adhesion with overlying layers. The copper-containing metal wire is formed in a metalized layer containing a dielectric material where the copper containing wires can be placed by inlaying a copper-containing material into a pattern of trenches and/or vias in the dielectric material. Ru can be selectively deposited on the surface of the copper-containing metal wires relative to the surface of the dielectric material. However, selective deposition of Ru cannot be achieved with complete fidelity and Ru can also be present of the surface of the dielectric material of the metalized layer.

Figure 1A:
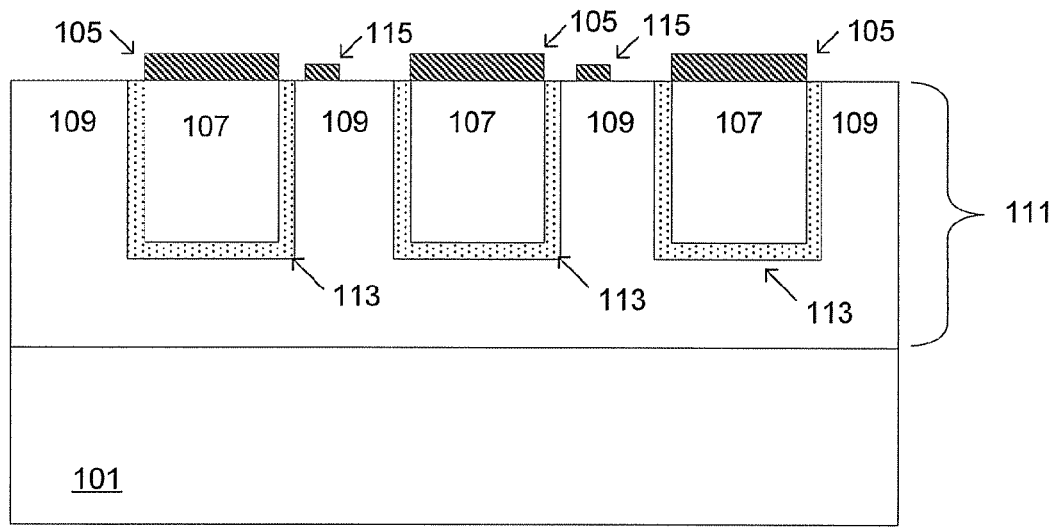
FIGS. 1A-1B show embodiments of semiconductor structures having Ru present on surfaces of the semiconductor structure.

As shown in FIG. 1A, deposition of Ru forms a cap layer 105 on the surface copper-containing wires 107. The copper-containing wires 107 are formed by placement of copper-containing material in a dielectric material 109 to form a metalized layer 111. For simplicity, the copper-containing wires 107 are shown filled into individual trenches; those skilled in the art will readily understand that the innovations disclosed herein are readily applicable to more complicated patterns of trenches and vias. Due to the propensity of copper to diffusion into the surround dielectric material 109, the trenches and/or vias into which the copper-containing wires 107 are formed are typically lined with a barrier metal layer 113.

The dielectric material can be any material suitable for use as an insulator within the semiconductor structure. In one embodiment, the dielectric material is silicon dioxide. In another embodiment, the dielectric material is a low-k material that has a dielectric constant less than the dielectric constant of silicon dioxide. A low-k material can contain silicon atoms.

Materials from which the barrier metal layer can be formed include one or more of tantalum, tantalum nitride, titanium, titanium nitride and combinations thereof. The barrier metal layer can be placed using well-known techniques including sputter deposition, CVD, atomic layer deposition (ALD) and the like prior to or contemporaneous with the formation of the copper-containing wires 107. The copper-containing wires 107 are placed by well-known electroplating and/or damascene techniques. The copper-containing wires 107 and dielectric material 109 forming metalized layer 111 are formed over an underlying layer or layers 101, which can be one or more of another metalized layer, a device layer upon which transistors, capacitors, and/or other device structures are formed, and a semiconductor substrate.

In one embodiment, the width of the copper-containing wires 107 is from about 25 to about 60 nm. In another embodiment, the width of the copper-containing wires is from about 30 to about 55 nm. In yet another embodiment, the width of the copper-containing wires is from about 30 to about 50 nm.

Ru can be selectively deposited to form cap layer 105. However, the selective deposition process may potentially lack complete fidelity and traces of Ru can potentially be found on the surface of the dielectric material 109 located between the copper-containing wires 107. Traces of Ru 115 found on the surface of the dielectric material are not intentionally deposited at that location.

Figure 1B:
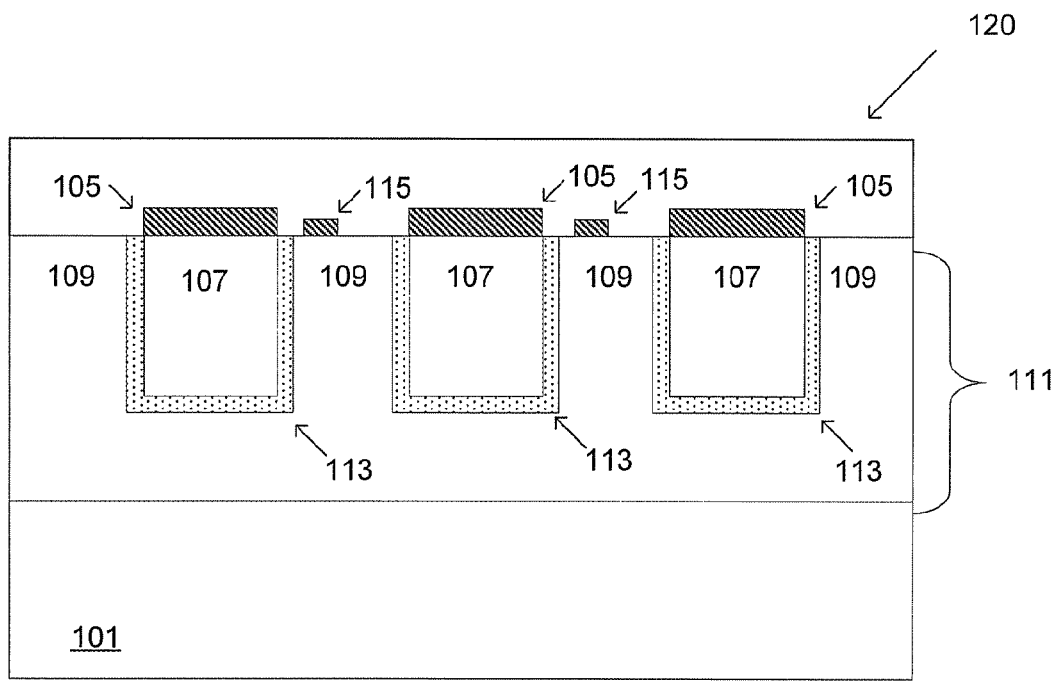

As shown in FIG. 1B, an additional layer 120 can be deposited over the copper-containing wires 107 in the process of forming a finished device. The additional layer 120 can be any material desired for the formation of additional layers or structures of the metalized layer 103. The presence of traces of Ru 115 on the surface of the dielectric material can create a conductive path between adjacent copper-containing wires 107 that can create electrical shorts and leaks between copper-containing wires. The presence of traces of Ru 115 on the surface of the dielectric material 109 can lead to device failure.

Ru material can be removed from the semiconductor structure by using wet chemicals. A cleaning solution containing one or more selected from permanganate ion, orthoperiodic ion, and hypochlorous ion having a pH equal to or greater than about 4 is contacted with the semiconductor structure. The solution dissolves Ru while not dissolving Cu. In another embodiment, the cleaning solution has a pH equal to or greater than about 6.

Contacting the cleaning solution with the semiconductor structure results in the removal of a portion of the Ru contained in the semiconductor structure. Regions of the semiconductor structure that contain a significant amount of Ru, such as the cap layer 105, have a reduction in the amount of Ru present in that region. For example, contact of the cleaning solution with the semiconductor structure will result in a decreased thickness of the cap layer 105. Regions of the semiconductor structure that contain only trace amounts of Ru can have substantially all of the trace amounts of Ru removed from the surface of the semiconductor device in that region. For example, contact of the cleaning solution with the semiconductor structure can result in the removal of substantially all of the traces of Ru 115 present on the surface of the dielectric material.

In one embodiment, a region having a trace amount of Ru formed thereon has thickness or smallest dimension from about 1 to about 50 nm. In another embodiment, a region having a trace amount of Ru formed thereon has thickness or smallest dimension from about 1 to about 25 nm. In yet another embodiment, a region having a trace amount of Ru formed thereon has thickness or smallest dimension from about 1 to about 10 nm. In still yet another embodiment, a region having a trace amount of Ru formed thereon has thickness or smallest dimension from about 0.1 to about 5 nm.

In one embodiment, contact of the cleaning solution containing one or more selected from permanganate ion, orthoperiodic ion, and hypochlorous ion with the semiconductor structure reduces the thickness of Ru formed on an exposed surface of the semiconductor structure from about 1 to about 50 nm. In another embodiment, contact of the cleaning solution with the semiconductor structure reduces the thickness of Ru formed on an exposed surface of the semiconductor structure from about 1 to about 25 nm. In yet another embodiment, contact of the cleaning solution with the semiconductor structure reduces the thickness of Ru formed on an exposed surface of the semiconductor structure from about 1 to about 10 nm. In still yet another embodiment, contact of the cleaning solution with the semiconductor structure reduces the thickness of Ru formed on an exposed surface of the semiconductor structure from about 0.1 to about 5 nm. An exposed surface of the semiconductor structure is a surface upon which contact with the cleaning solution occurs upon application of the cleaning solution.

Specific embodiments in accordance with the innovations disclosed herein will be described. The innovations disclosed herein allow for the removal of the Ru undesirable presence on surfaces of the semiconductor structure without disturbing copper-containing wires. The removed Ru is Ru whose presence can result in the formation of electrical shorts and leaks and other undesirable effects, such as difficulty in placement of metal in a metalized layer placed over a Ru cap layer, as will be described below.

Those skilled in the art will recognize that well-known semiconductor fabrication techniques including depositing materials, masking, photolithography, etching, and implanting are useful in forming the described devices or structures. Deposition of materials for forming semiconductor structures can be by low pressure chemical vapor deposition, chemical vapor deposition, atomic layer deposition, and the like. Conserved reference numbers match like elements.

Terms, such as "on," "above," "below," and "over," used herein, are defined with respect to the plane defined by the surface of a semiconductor substrate. The terms "on," "above," "over," etc. indicate that the subject element is farther away from the plane of the semiconductor substrate than another element referred to as a spatial reference. The term "below" and similar terms indicate that the subject element is closer to the plane of the semiconductor substrate than another element referred to as a spatial reference. The terms "on," "above," "below," and "over," etc. only indicate a relative spatial relationship and do not necessarily indicate that any particular elements are in physical contact. The preceding definitions apply throughout this document. The term "thickness" as it relates to the dimensions of a region of Ru on the surface of the semiconductor structure is herein defined as the dimension perpendicular to the surface upon which such region of Ru is found.

Figure 2A:
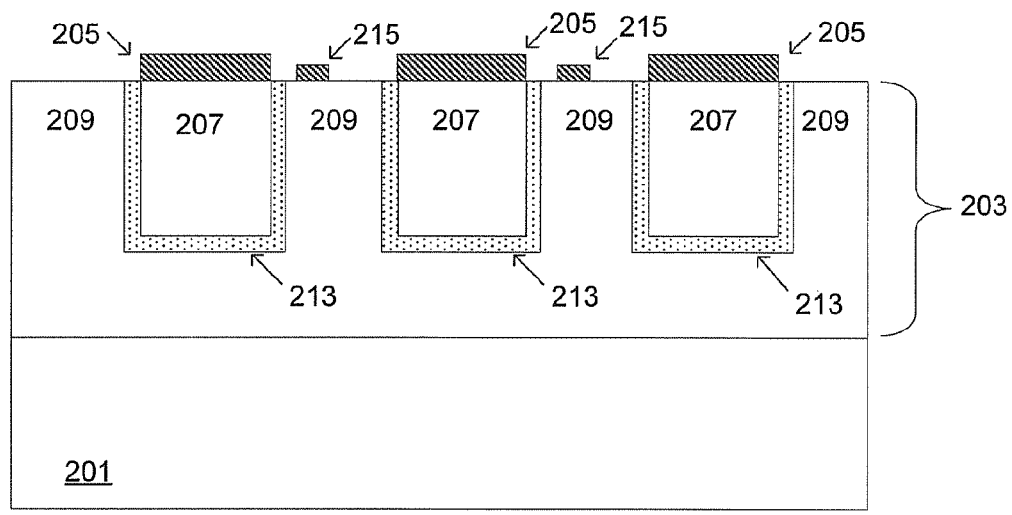
FIGS. 2A-2B show embodiments of semiconductor structures having Ru cap layers where Ru is removed from certain surfaces of the semiconductor structures in accordance with embodiments of the methods disclosed herein.
Figure 2B:
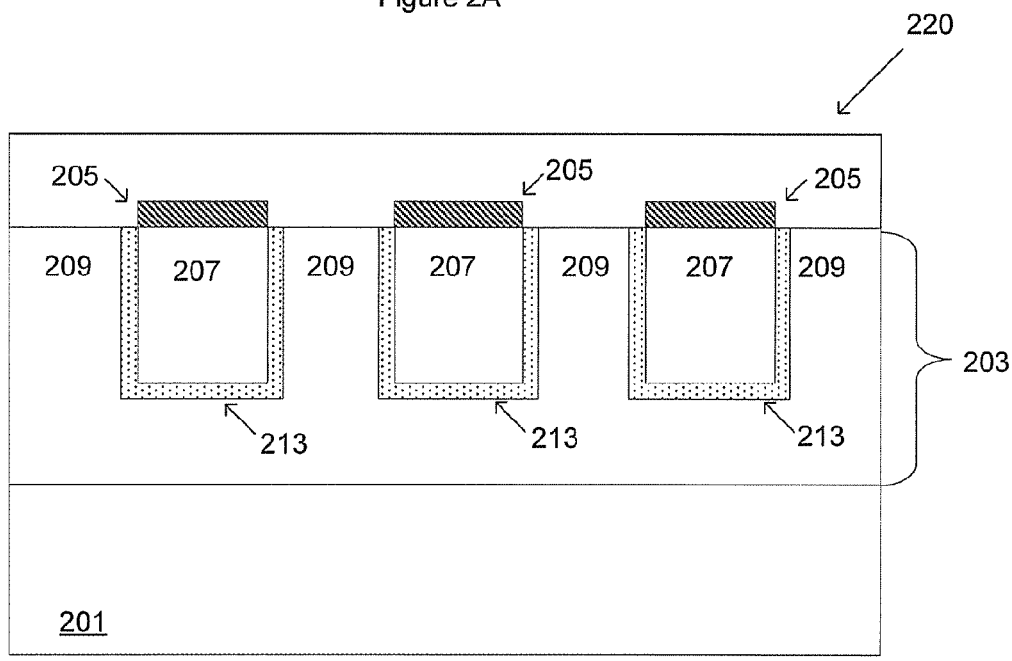

In FIGS. 2A-2B, one embodiment of the methods disclosed herein is shown. A metalized layer 203 is shown formed over an underlying layer or layers 201. Underlying layer or layers 201 can be one or more of another metalized layer, a device layer upon which transistors, capacitors, and/or other device structures are formed by selective ion doping, and a semiconductor substrate. The metalized layer 203 is formed by placement of trenches/and or vias in the dielectric material 209. A barrier metal layer 213 can be present to prevent the migration of Cu from the copper-containing wires 207 into the dielectric material 209. For simplicity, a simple trench pattern for the copper-containing wires 207 is shown. Those skilled in the art will readily understand that the innovations disclosed here are applicable to any pattern of trenches or vias containing copper-containing wires.

In FIG. 2A, a cap layer 205 containing Ru is selectively deposited on the surface of the copper-containing wires 207. As shown, the selective deposition forms a thick Ru-containing cap layer on the surface of the copper-containing wires 207. In one embodiment, the thickness of the cap layer 205 formed on the surface of the copper-containing wires 207 is from about 2 nm to about 1 μm. In another embodiment, the thickness of the cap layer 205 formed on the surface of the copper-containing wires 207 is from about 1 to about 500 nm. In yet another embodiment, the thickness of the cap layer 205 formed on the surface of the copper-containing wires 207 is from about 1 to about 100 nm.

The selective deposition process is usually not performed with complete accuracy. As shown in FIG. 2A, traces of Ru 215 are inadvertently deposited on the surface of the dielectric material 209. The presence of traces of Ru 215 in the region between the copper-containing wires 207 can result in electrical shorts and current leakage between adjacent copper-containing wires 207. The traces of Ru 215 have the dimensions described above for regions of trace amounts of Ru.

FIG. 2B shows the semiconductor structure from FIG. 2A after contact with the cleaning solution described above. The traces of Ru 215 are substantially removed by contact with the cleaning solution. Contact of the cleaning solution can potentially remove Ru from the cap layer 205. However, the large dimensions of the cap layer 205, as described above, prevent the complete removal of the cap layer 205. In one embodiment, the cap layer 205 is initially deposited to have a larger thickness than the thickness of the cap layer 205 in a semiconductor structure or device fashioned from the semiconductor structure prior to contact with the cleaning solution.

An additional layer 220 of material can be deposited over the metalized layer 203 after the traces of Ru 215 are removed from the surface of the dielectric material 209. The additional layer 220 can be any material desired for the formation of additional layers or structures of the metalized layer 203.

In one embodiment, contact between the semiconductor structure and the cleaning solution is from about 5 seconds to about 30 minutes. In one embodiment, contact between the semiconductor structure and the cleaning solution is from about 5 to about 30 minutes. In yet another embodiment, contact between the semiconductor structure and the cleaning solution is for at least about 5 seconds. In still yet another embodiment, contact between the semiconductor structure and the cleaning solution is for at least about 5 minutes.

In one embodiment, contact between the semiconductor structure and the cleaning solution occurs at room temperature. In another embodiment, contact between the semiconductor structure and the cleaning solution occurs at a temperature from about 15 to about 85° C. In yet another embodiment, contact between the semiconductor structure and the cleaning solution occurs at a temperature from about 20 to about 30° C.

The cleaning solution can contain one or more permanganate-, orthoperiodic-, or hypochlorous-containing compounds selected from $KMnO_4$, $NH_4MnO_4$, $H_5IO_6$, $NaClO$, and $Ca(ClO)_2$. Further, the cleaning solution can contain one or more base compounds to adjust the pH of the cleaning solution, such as KOH, NaOH, tetramethylammonium hydroxide (TMAH), $NH_4OH$, choline, tetraethylammonium hydroxide (TEAH) and so on. The cleaning solution can also additionally contain one or more of acids, such as HCl, $H_2SO_4$, acetic acid, $HNO_3$, HF and $H_3PO_4$ as appropriate.

Embodiments of the cleaning solution include the following: $KMnO_4$ and KOH mixture; $KMnO_4$ and NaOH mixture; $KMnO_4$ and $NH_4OH$ mixture; $KMnO_4$ and TMAH mixture; $KMnO_4$ and choline mixture; $KMnO_4$ and TEAH mixture; $NH_4MnO_4$ and $NH_4OH$ mixture; $NH_4MnO_4$ and KOH mixture; $NH_4MnO_4$ and NaOH mixture; $NH_4MnO_4$ and TMAH mixture; $NH_4MnO_4$ and choline mixture; $NH_4MnO_4$ and TEAH mixture; $H_5IO_6$ and $NH_4OH$ mixture; $H_5IO_6$ and TMAH mixture; $H_5IO_6$ and choline mixture; $H_5IO_6$ and TEAH mixture; $H_5IO_6$ and NaOH mixture, $H_5IO_6$ and KOH mixture; NaClO; $Ca(ClO)_2$; NaClO and HCl mixture; NaClO and $H_3PO_4$ mixture; NaClO and $H_2SO_4$ mixture; NaClO and $CH_3COOH$ mixture, NaClO and HF mixture; NaClO and $HNO_3$ mixture, $Ca(ClO)_2$ and HCl mixture; $Ca(ClO)_2$ and $H_3PO_4$ mixture, $Ca(ClO)_2$ and $CH_3COOH$ mixture; $Ca(ClO)_2$ and HF mixture; $Ca(ClO)_2$ and $H_2SO_4$ mixture, $Ca(ClO)_2$ and $HNO_3$ mixture.

In one embodiment, the concentration of one of permanganate ion, orthoperiodic ion or hypochlorous ion in the cleaning solution is from about 0.01 mM to 5 M. In another embodiment, the concentration of one of permanganate ion, orthoperiodic ion or hypochlorous ion in the cleaning solution is from about 100 to 1000 mM. In yet another embodiment, the concentration of one of permanganate ion, orthoperiodic ion or hypochlorous ion in the cleaning solution is from about 10 to 500 mM.

Figure 3A:
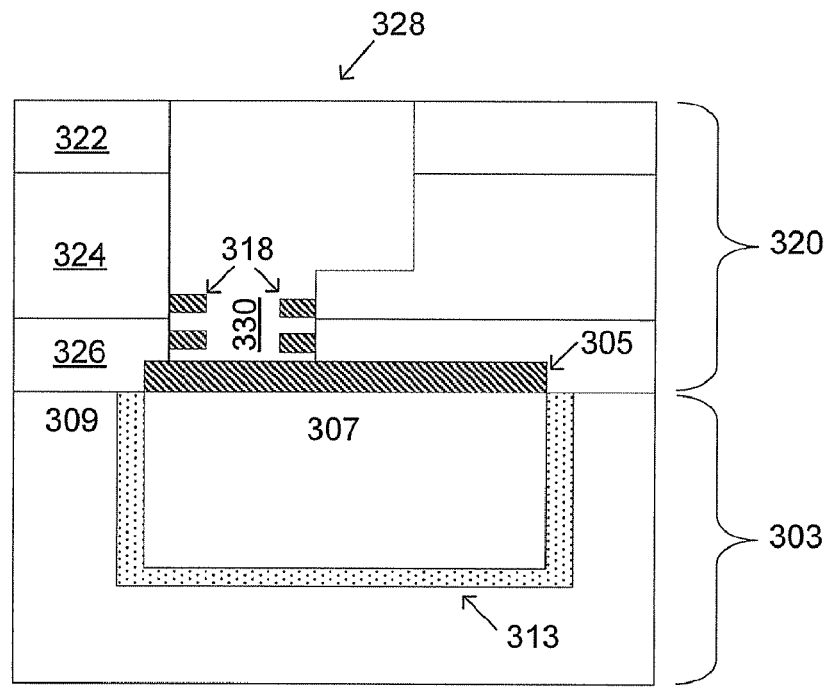
FIGS. 3A-3B show embodiments of semiconductor structures having a layer with a via hall opening for contact with an underlying metalized layer.
Figure 3B:
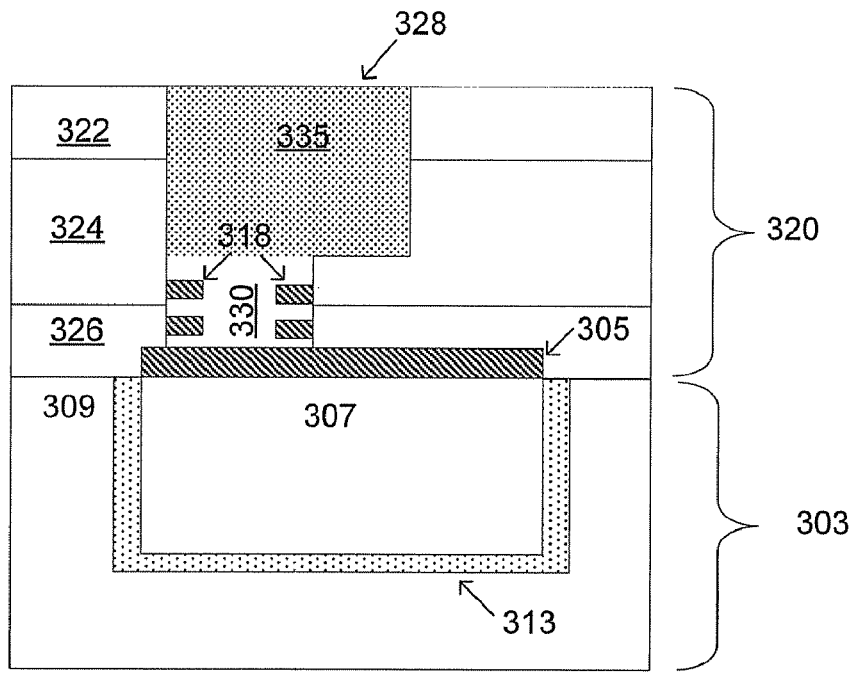

FIGS. 3A-3B show an additional embodiment in which the innovations disclosed herein can be applied. FIG. 3A shows an underlying layer 303 overlaid by a metalized layer 320 in the process of formation. The underlying layer 303 can be an another metalized layer or a device layer being a silicon layer doped with ions to form transistors, capacitors and/or other functional devices. FIG. 3A depicts the underlying layer 303 as a metalized layer having copper-containing wires 307 and a dielectric material 309. A barrier metal layer 313 can be present to prevent diffusion of copper from the copper-containing wires 307 into the dielectric material 309. A Ru-containing cap layer 305 is formed over the surface of the copper-containing wires 307. Layer 320 in FIG. 3A is a metalized layer in the process of formation. Layer 320 can have a hard mask 322, a silicon-containing layer 324 and a base cap 326, which can be SiCN and/or SiC, as shown.

A trench and via pattern 328 is formed by known etching processes performed on the various layers of metalized layer 320. Upon extension of the trench and via pattern toward the metalized layer 303, traces of Ru 318 can be deposited on the surfaces of the trench and via pattern. As shown in FIG. 3A, traces of Ru 318 can be present on the surface of the via contact hole 330 near the location where contact is made with metalized layer 303. As shown in FIG. 3B, the presence of traces of Ru 318 on the surface of the via contact hole 330 interferes with the placement of metal 335 into metalized layer 320 by damascene and/or electroplating techniques. Traditional methods of cleanings are often ineffective in removing traces of Ru 318 from the contact hole 330 due to the difficulty to dissolve Ru traces 318 without Cu dissolution.

Figure 4A:
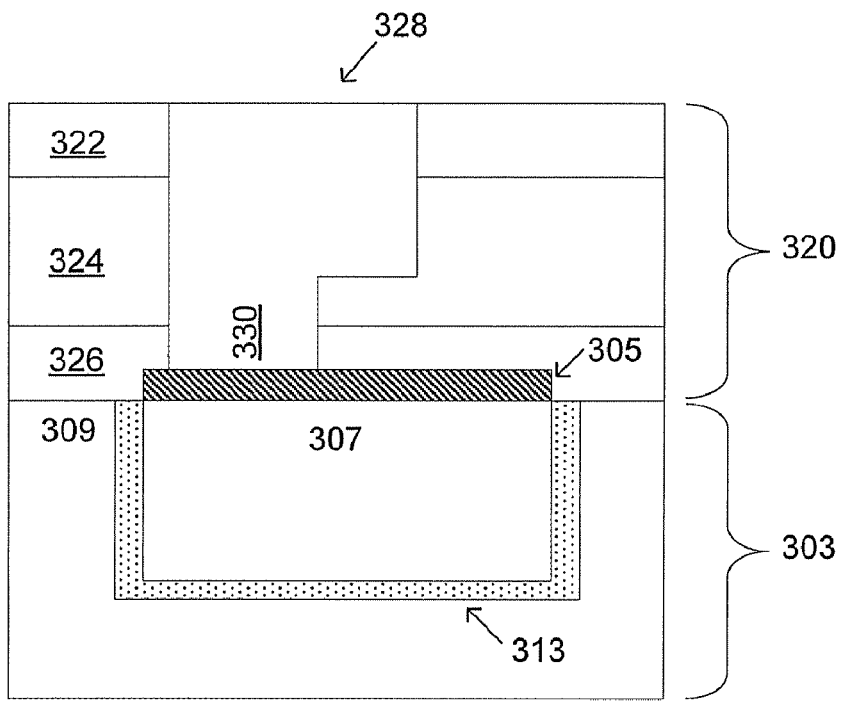
FIGS. 4A-4B show embodiments of semiconductor structures having Ru removed from certain surfaces of the semiconductor structures in accordance with embodiments of the methods disclosed herein.
Figure 4B:
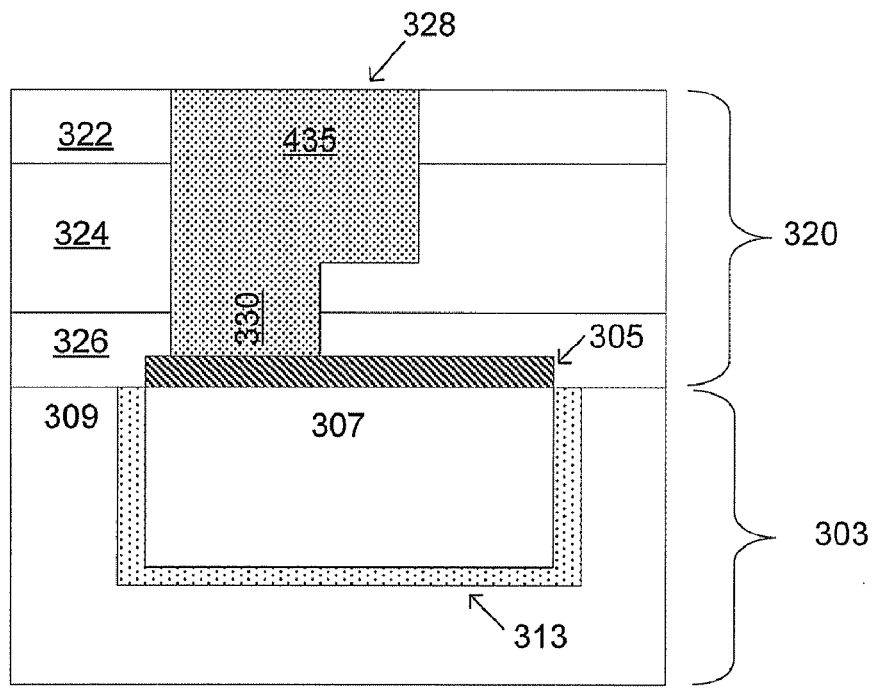

FIGS. 4A-4B show the effect of using the cleaning solution described above on the structure described in FIG. 3A above. Same reference numbers refer to like structures and features. FIG. 4A shows the structure of FIG. 3A after contact with the cleaning solution described above. Substantially all of the traces of Ru 318 are removed from the surface of the via contact hall 330. As shown in FIG. 4B, placement of metal 435 into metalized layer 320 by damascene and/or electroplating techniques can be properly made after removal of traces of Ru 318. Due to the thickness of the Ru cap layer 305 described above, contact of the cleaning solution does not significantly alter the structure of the Ru cap layer 305.

Figure 5A:
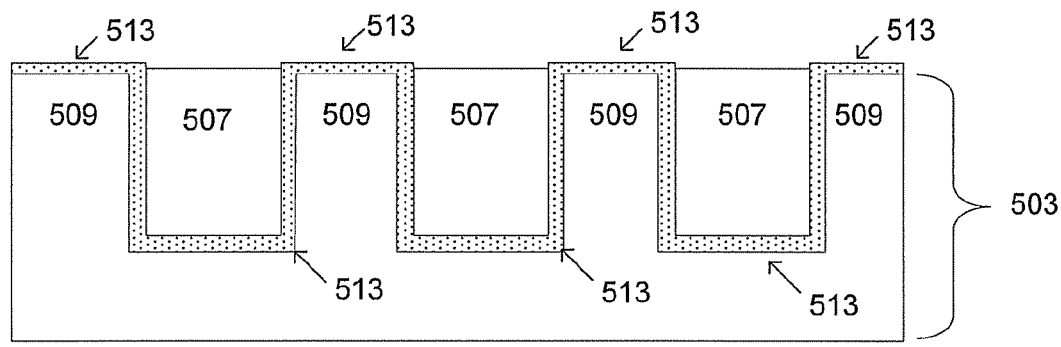
FIGS. 5A-5C show embodiments of semiconductor structures having a Ru-based barrier metal layer where Ru is removed from certain surfaces of the semiconductor structures in accordance with embodiments of the methods disclosed herein.
Figure 5B:
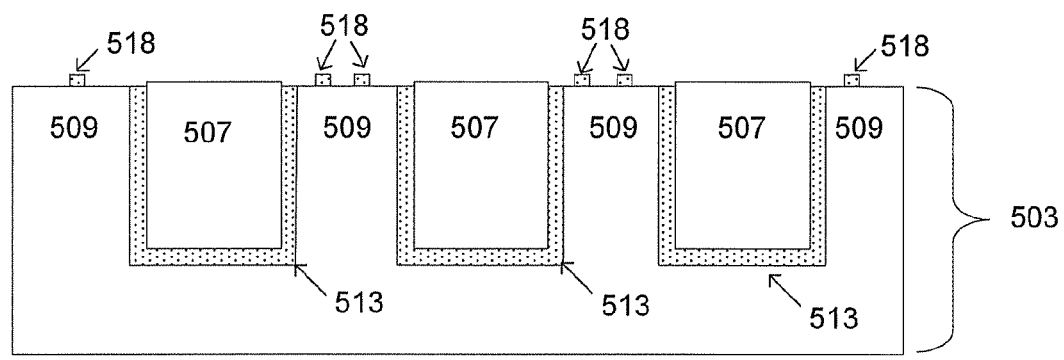
Figure 5C:
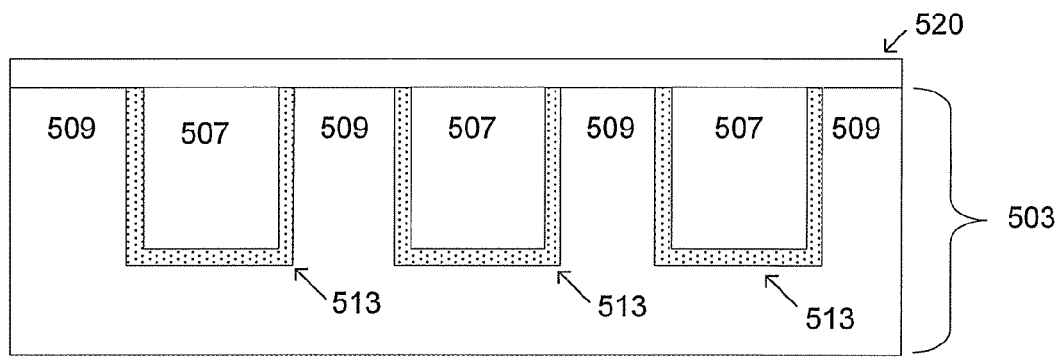

FIGS. 5A-5C show an additional embodiment in accordance with the innovations described herein. FIG. 5A shows a metalized layer 503 having copper-containing wires 507 and a dielectric material 509. A barrier metal layer 513 separates the copper-containing wires 507 and the dielectric material 509. In this embodiment, the barrier metal layer 513 contains Ru. The barrier metal layer 513 functions to prevent diffusion of copper into the dielectric material 509 and to improve Cu filling with electroplating techniques.

The barrier metal layer 513 is typically placed by appropriated deposition techniques prior to formation of the copper-containing wires 507. As such, the barrier metal layer 513 lines the trench and/or via pattern formed in the dielectric material 509 as well as the surface of the dielectric material between the copper-containing wires 507. The presence of the Ru-containing barrier metal layer 513 on the surface of the dielectric material 509 can lead to scratching and other non-desirable effects when chemical mechanical polishing (CMP) is performed to level the surface of the copper-containing wires 507 after placement.

As shown in FIG. 5B, the portion of the barrier metal layer 513 present on the surface of the dielectric material 509 between the copper-containing wires 507 is removed by known etching and/or polishing techniques. However, such etching techniques can leave behind traces of Ru 518 on the surface of the dielectric material 509. As discussed above, the presence of traces of Ru 518 can lead to undesirable effects such as electrical shorts and current leaks between adjacent copper-containing wires.

FIG. 5C shows the structure from FIG. 5B after contact with the cleaning solution described above. Substantially all of the traces of Ru 518 are removed from the surface of the dielectric material 509 allowing for further processing steps to performed on the semiconductor structure without the delirious effects of trace amounts of Ru 518. Additional material 520 is placed over the copper-containing wires 507 in forming a finished device. The additional layer 520 can be any material desired for the formation of additional layers or structures of the metalized layer 503.

In a further embodiment, the structure shown in FIG. 5A is contacted with a cleaning solution prior to performance of any CMP process. The cleaning solution having the composition described above can be included in the slurry employed for CMP. In this scheme, it is not necessarily to be contacted with the solution prior to the CMP. As such, the structure shown in FIG. 5C can be achieved by the performance of CMP including the cleaning solution in the CMP slurry and/or the post-CMP cleaning chemicals.

The techniques described herein can be applied to any semiconductor structure containing Ru, where the removal of traces of Ru from specific regions of the semiconductor structure is desirable. In particular, the techniques described herein can be applied for Ru-containing electrode formation in capacitor structures and for structure containing an Ru cap layer.

With respect to any figure or numerical range for a given characteristic, a figure or a parameter from one range may be combined with another figure or a parameter from a different range for the same characteristic to generate a numerical range.

Other than in the operating examples, or where otherwise indicated, all numbers, values and/or expressions referring to quantities of ingredients, reaction conditions, etc., used in the specification and claims are to be understood as modified in all instances by the term "about."

While certain embodiments have been described, these embodiments have been presented by way of example only, and are not intended to limit the scope of the inventions. Indeed, the novel methods described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

What is claimed is:

1. A method for removing Ru, comprising:
contacting a semiconductor structure comprising a metalized layer, the metalized layer having a copper-containing wire formed in a dielectric material, with a cleaning solution comprising one or more selected from the group consisting of permanganate ion, orthoperiodic ion, and hypochlorous ion and the cleaning solution having a pH equal to or greater than about 4, to remove Ru from the dielectric material.

2. The method of claim 1, wherein Ru is present on the surface of the dielectric material of the semiconductor structure.

3. The method of claim 2, wherein contacting the semiconductor structure with the cleaning solution removes substantially all of the Ru present of the surface of the dielectric material of the semiconductor structure.

4. The method of claim 2, wherein contacting the semiconductor structure with the cleaning solution removes at least a portion of the Ru present of the surface of the dielectric material of the semiconductor structure.

5. The method of claim 1, wherein the semiconductor structure further comprises a Ru-containing cap layer formed over the copper-containing wire, wherein contact of the semiconductor structure with the cleaning solution does not completely remove the cap layer.

6. The method of claim 1, wherein the cleaning solution comprises one or more selected from $KMnO_4$, $NH_4MnO_4$, $H_5IO_6$, $NaClO$, and $Ca(ClO)_2$.

7. The method of claim 1, wherein the cleaning solution has a concentration of one or more of permanganate ion, orthoperiodic ion, and hypochlorous ion from about 0.01 mM to about 5 M.

8. The method of claim 1, wherein the pH of the cleaning solution is equal to or greater than about 6.

9. A method for removing Ru from the surface of a dielectric material, comprising:
providing a semiconductor structure comprising a metalized layer having a copper-containing wire formed in a dielectric material;
selectively depositing Ru-containing material to form a cap layer on the surface of the copper-containing wire; and
removing Ru present on the surface of the dielectric material by contacting the surface of the dielectric material with a cleaning solution comprising one or more selected from the group consisting of permanganate ion, orthoperiodic ion, and hypochlorous ion and the cleaning solution having a pH equal to or greater than about 4,
wherein selectively depositing Ru-containing material to form a cap layer results in Ru present on the surface of the dielectric material.

10. The method of claim 9, wherein the Ru present on the surface of the dielectric material is a trace amount of Ru.

11. The method of claim 9, wherein the Ru present on the surface of the dielectric material has a smallest dimension from about 0.1 to about 50 nm.

12. The method of claim 9, wherein contacting the semiconductor structure with the cleaning solution removes substantially all of the Ru present of the surface of the dielectric material of the semiconductor structure.

13. The method of claim 9, wherein the cleaning solution comprises one or more selected from $KMnO_4$, $NH_4MnO_4$, $H_5IO_6$, $NaClO$, and $Ca(ClO)_2$.

14. The method of claim 9, wherein the cleaning solution has a concentration of one or more of permanganate ion, orthoperiodic ion, and hypochlorous ion from about 0.01 mM to about 5 M.

15. The method of claim 9, wherein the pH of the cleaning solution is equal to or greater than about 6.

16. A method for removing Ru from a surface of a semiconductor structure, comprising:
contacting a semiconductor structure with a cleaning solution comprising one or more selected from the group consisting of permanganate ion, orthoperiodic ion, and hypochlorous ion and the cleaning solution having a pH equal to or greater than about 4, to remove Ru from a surface of the semiconductor structure,
wherein the semiconductor has a trace amount of Ru depositing on a surface of the semiconductor structure.

17. The method of claim 16, wherein the semiconductor structure comprises at least one layer having a via contact hole for forming a contact with an underlying layer and wherein Ru is located on the surface of the via contact hole.

18. The method of claim 17, wherein the underlying layer is a metalized layer having a copper-containing wire formed in a dielectric material.

19. The method of claim 17, wherein substantially all of the Ru deposited on the surface of the via contact hole is removed by contact with the cleaning solution.

20. The method of claim 16, wherein the cleaning solution comprises one or more selected from $KMnO_4$, $NH_4MnO_4$, $H_5IO_6$, $NaClO$, and $Ca(ClO)_2$.

* * * * *